United States Patent
Golov

(10) Patent No.: US 11,101,014 B2
(45) Date of Patent: Aug. 24, 2021

(54) TWO-STAGE FLASH PROGRAMMING FOR EMBEDDED SYSTEMS

(71) Applicant: Micron Technology, Inc., Boise, ID (US)

(72) Inventor: Gil Golov, Backnang (DE)

(73) Assignee: Micron Technology, Inc., Boise, ID (US)

(*) Notice: Subject to any disclaimer, the term of this patent is extended or adjusted under 35 U.S.C. 154(b) by 174 days.

(21) Appl. No.: 16/353,966

(22) Filed: Mar. 14, 2019

(65) Prior Publication Data

US 2020/0294612 A1   Sep. 17, 2020

(51) Int. Cl.
| | | |
|---|---|---|
| *G06F 11/22* | (2006.01) | |
| *G11C 29/12* | (2006.01) | |
| *G06F 8/61* | (2018.01) | |
| *G11C 11/56* | (2006.01) | |

(52) U.S. Cl.
CPC .............. *G11C 29/12* (2013.01); *G06F 8/63* (2013.01); *G06F 11/22* (2013.01); *G06F 11/2284* (2013.01); *G11C 11/5628* (2013.01)

(58) Field of Classification Search
CPC ...... G06F 11/2284; G06F 11/22; G06F 8/654; G11C 29/12; G11C 11/5628; G11C 29/08; G11C 16/10; G11C 2029/0407
See application file for complete search history.

(56) References Cited

U.S. PATENT DOCUMENTS

| | | | | | |
|---|---|---|---|---|---|
| 5,987,625 | A  | * | 11/1999 | Wolff ................. | G06F 11/2294 713/2 |
| 7,783,926 | B2 | * | 8/2010 | Chu Chen ........... | G06F 11/2284 714/36 |
| 2003/0074610 | A1 | * | 4/2003 | Chen ..................... | G11C 29/12 714/710 |
| 2013/0173970 | A1 | * | 7/2013 | Kleveland ............ | G11C 29/808 714/710 |
| 2016/0246608 | A1 | * | 8/2016 | Newham ................. | G06F 13/28 |
| 2017/0147455 | A1 | * | 5/2017 | Sakuma .............. | G06F 11/2046 |
| 2017/0277455 | A1 | * | 9/2017 | Sunada .............. | G06F 11/2284 |
| 2018/0300202 | A1 | * | 10/2018 | Lambert ............... | G06F 9/4405 |
| 2019/0113568 | A1 | * | 4/2019 | Bowling ............ | G01R 31/3177 |

* cited by examiner

*Primary Examiner* — Yolanda L Wilson
(74) *Attorney, Agent, or Firm* — Greenberg Traurig

(57) ABSTRACT

Disclosed are devices and methods for improving the initialization of devices housing memories. In one embodiment, a method is disclosed comprising writing a test program to a first region of a memory device during production of the memory device; executing a self-test program in response to detecting a first power up of the memory device, the self-test program stored within the test program; and retrieving and installing an image from a remote data source in response to detecting a subsequent power up of the memory device, the retrieving performed by the test program.

21 Claims, 5 Drawing Sheets

TWO-STAGE FLASH PROGRAMMING FOR EMBEDDED SYSTEMS

COPYRIGHT NOTICE

This application includes material that is subject to copyright protection. The copyright owner has no objection to the facsimile reproduction by anyone of the patent disclosure, as it appears in the Patent and Trademark Office files or records, but otherwise reserves all copyright rights whatsoever.

BACKGROUND

The disclosed embodiments are directed toward in-vehicle computing systems and, in particular, to devices and methods for programming of electronic control units (ECUs) in a vehicle.

A modern car contains dozen of ECUs. These ECUs can be used for infotainment systems or may be used as critical systems such as in autonomous vehicles. Many ECUs require a large Flash memory for storing software, media, and navigation maps. The densities are in the range of hundreds of gigabytes or more. Currently, during ECU production the content of the flash is programmed, a lengthy process that may take dozens of minutes and even more, which slows down the ECU production line and increases costs. To overcome the programming time during production, manufacturers use bulk programming, i.e., large quantities of Flash devices are programmed in parallel before being soldered to the PCBs. Further, some Flash devices might suffer from the soldering process and lose data during the high temperature soldering process. Thus, current bulk programming methods are no longer able to keep up with improvements in Flash memory.

The disclosed embodiments remedy these and other technical problems by providing a two-stage Flash programming process that increases the manufacturing speed of Flash devices and avoids data loss.

BRIEF DESCRIPTION OF THE FIGURES

The preceding and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

The disclosed embodiments remedy these and other deficiencies in the art by describing systems and methods to overcome the programming time bottleneck during ECU production by enabling two programming stages, a short one that contains a test program and remote programming software for ECU production and a second stage that occurs during or after assembly, where the final software is being programmed over the air.

Figure 1:
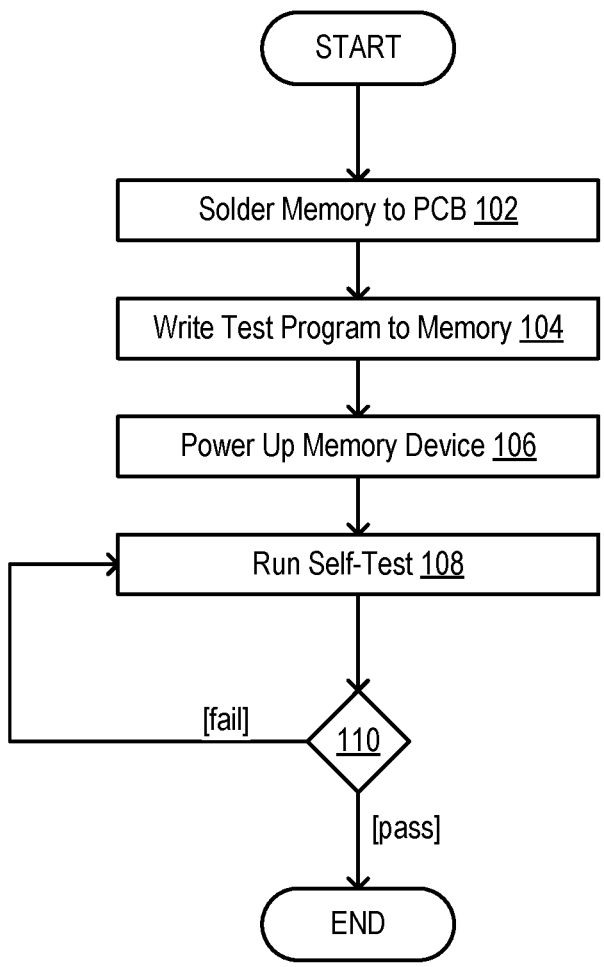
FIG. 1 is a flow diagram illustrating a method for installing a memory according to some embodiments of the disclosure.

FIG. 1 is a flow diagram illustrating a method for installing a memory according to some embodiments of the disclosure. In one embodiment, a Tier 1 manufacturer performs the method (100). In this embodiment, some or all of the steps may be implemented as part of a production line system, and are fully automated. Specifically, in some embodiments, the method (100) is implemented as part of an industrial surface-mount technology (SMT) production process.

In step 102, a memory is soldered to a printed circuit board (PCB).

In one embodiment, the memory comprises a Flash device. In some embodiments, the memory soldered to the PCB comprises other types of non-volatile memory or storage. In some embodiments, the method (100) employs reflow soldering to mount a memory to a PCB. In this embodiment, solder paste is applied to the PCB using a screen printer. The memory is then positioned on the PCB using, for example, pick-and-place machines, chip shooters, etc. The memory leads are placed in direct contact with the solder-pasted pads. The memory is then passed through a solder reflow oven whereby the solder paste is heated until liquid (reflowed) then cooled until the solder hardens and creates permanent interconnection between the component leads and the PCB. The specific details of soldering a memory to a PCB is not intended to limit the disclosure and other soldering methods may be used.

In some embodiments, the PCB comprises a PCB installed within an ECU. As used herein, an ECU refers to an embedded system to be installed within a vehicle. Examples of ECUs include door control unit (DCU), engine control unit, electric power steering control unit (PSCU), human-machine interface (HMI), powertrain control module (PCM), seat control unit, speed control unit (SCU), telematic control unit (TCU), transmission control unit (TCU), brake control module (BCM; ABS or ESC), or battery management system (BMS) devices. While described primarily in the context of ECU devices, any type of computing system including a Flash memory may employ the embodiments disclose herein and embodiments referencing ECU devices are provided as examples.

In step 104, a test program is written to the memory.

In the illustrated embodiment, after soldering (and, if desired, optical inspection), a small test program is written to the memory. In one embodiment, the test program is written using onboard or in-system programming interfaces such as in-circuit test (ICT) or IEEE 1149.1 (JTAG) or via an external connection such as a Universal Serial Bus (USB) or Universal Asynchronous Receiver/Transmitter (UART) connection. The specific details of how a test program is written to the memory is not limiting and various other methodologies for writing data to memory can be utilized.

In the illustrated embodiment, the test program comprises a small program. In some embodiments, the test program is designed to be only a few megabytes. In general, the size of the test program should be selected to reduce programming time to under one second. Thus, in some embodiments, the specific size of the test program is configured based on the writing method used and is not intended to be limiting.

The test program is configured to self-test the memory after production (discussed in steps 106 and 108). In some embodiments, the test program is additionally configured to test the device the memory is installed in as well. The test program is coded based on the underlying device housing the memory. Additionally, in some embodiments, the test program includes communications drivers to enable network interfaces of the ECU housing the memory. Examples of network interfaces include car area network (CAN) busses, Wireless Fidelity (Wi-Fi) adapters, cellular radios, satellite transmitters, Ethernet interfaces, and others. The test program additionally includes software to enable programming of the memory itself over a network. In brief, the test program includes a self-test program, communications drivers, and self-programming software to enable programming of the memory over a network.

In step 106, the memory is powered up. In one embodiment, after programming the test program, the device containing the memory can be automatically powered up after loading the test program. Alternatively, in step 106, the method awaits a command from external test equipment.

In step 108, a self-test portion of the test program is executed.

In one embodiment, the test program loaded in step 104 includes a power-on self-test (POST). In some embodiments, the POST in the memory is separate from a BIOS-level POST. In some embodiments, the POST stored in the memory is the same as the initial BIOS-level POST. In general, the POST analyzes the hardware of the device including the memory and confirms that the devices are accessible and functioning properly.

As described above, the test program includes one or more drivers, such as drivers for communications devices (e.g., Wi-Fi, Bluetooth, etc.). During the POST, these drivers are used to check the status of all devices initialized in the device housing the memory.

In step 110, the method (100) checks if the POST has run successful.

If the POST runs successfully, the method (100) ends and the device containing the memory is confirmed as functioning accurately. The device can be shut off and then continue to be produced according to the Tier 1 production line and schedule.

Alternatively, if the POST fails, the method (100) in some embodiments (not illustrated) may end. In this embodiment, the device is flagged by the production line as failing the POST and is separated from functional units for further inspection.

In an alternative embodiment (illustrated), the test program includes a self-healing function. As used herein, a self-healing function refers to a diagnostic routine that can self-correct errors occurring during POST operation. For instance, the diagnostic routine can be configured to reinstall drivers for hardware on the device in response to a POST failure.

In some embodiments, steps 108 and 110 are executed until the device passes the POST. Alternatively, in some embodiments, steps 108 and 110 are executed a fixed number of times. If the POST does not pass when the fixed number of times are executed, the device is flagged as non-functional and is separated from functional units for further inspection.

Figure 2:
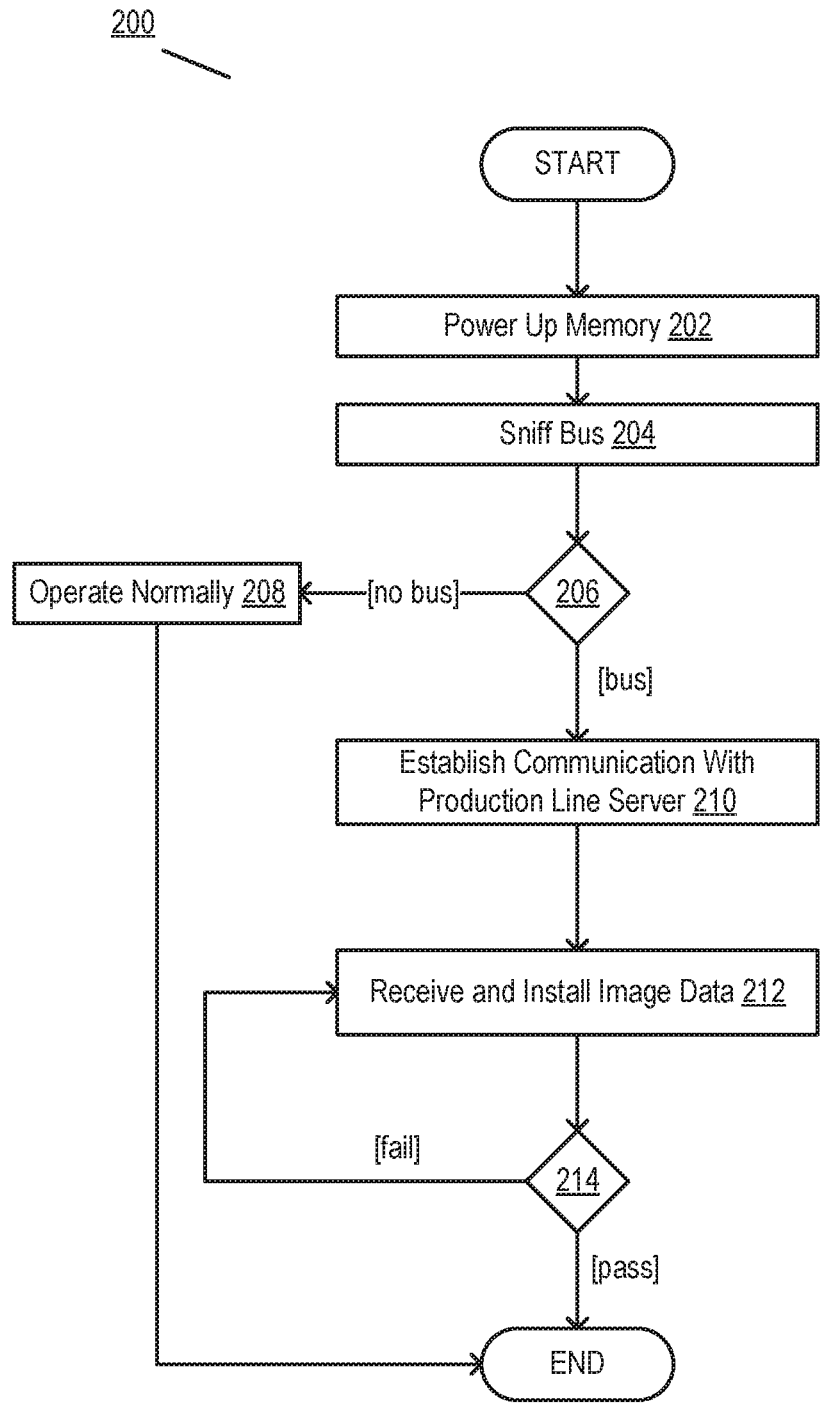
FIG. 2 is a flow diagram illustrating a method for initializing a memory according to some embodiments of the disclosure.

As illustrated above, the method (100) provides a mechanism for loading a small test program into a memory installed within a device and running a self-test on the memory upon an initial power up. In contrast to existing manufacturing schemes, the illustrated method (100) does not load all software (often in the gigabyte range) in the memory during manufacturing, thus removing a major bottleneck for production. FIG. 2, described herein, illustrates embodiments for finalizing the initialization of memory.

FIG. 2 is a flow diagram illustrating a method for initializing a memory according to some embodiments of the disclosure. In one embodiment, an original equipment manufacturer (OEM) performs the method (200). In this embodiment, some or all of the steps may be implemented as part of an OEM production line system, and are fully automated. Specifically, in some embodiments, the method (200) is implemented as part of an industrial installation production line of a vehicle manufacturer.

In step 202, the memory is powered up.

In the illustrated embodiment, the memory device is powered up during installation in another device. In one embodiment, the device containing the memory is installed in a larger system. In one embodiment, the memory is installed within an ECU when delivered to an OEM. During manufacturing of an automobile, the ECU is (in some cases, robotically) placed within a specific location of a vehicle and (immediately or at a later date) is booted up during the production of the automobile. In another embodiment, an OEM powers up multiple ECUs by placing the ECUs in a rack or similar structure and simultaneously powering up multiple ECUs at once. In yet another embodiment, that will be discussed in more detail herein, the memory is powered up during normal operations (e.g., during the user operation of an automobile including the ECU).

In another embodiment, the memory is powered up significantly after manufacturing. For example, the memory of an ECU may not be powered on until after the vehicle housing the ECU is assembled and delivered for long-term storage.

In step 204, the test program in the memory sniffs for the presence of a bus and, in step 206, the method (200) determines if a bus was found.

In one embodiment, the bus comprises a CAN bus. In some embodiments, step 204 is optional. However, in other embodiments, the test program sniffs for a bus in step 204 to determine whether the device is installed in an appropriate location before loading proceeding with the method (200). In this manner, step 204 prevents a memory device from performing steps 210-214 unnecessarily.

As described above, in one embodiment, the bus comprises a CAN bus. Thus, in steps 204-206, the memory sniffs for the presence of such a bus which indicates that the memory is located within an automobile. Thus, in the event that the memory is powered on prior to final installation, steps 204-206 prevent the memory from potentially exposing sensitive information (e.g., memory addresses, cryptographic keys, etc.) to unauthorized parties. In other embodiments, other techniques may be used to confirm the location of a vehicle (e.g., using radio-frequency identifier tags).

In step 208, the memory device is operated normally when no bus is detected (e.g., during Tier 1 manufacturing). As described above, step 208 may be executed when the memory is not located in a vehicle (i.e., no CAN bus is sniffed).

In step 210, the memory establishes communication with a production line server if a bus is detected.

In some embodiments, the method (200) includes an additional step of determining if the memory is already initialized before executed step 210. As will be described, steps 212-214 retrieve and install data into the memory. If these steps have already been successfully be performed, there is no need to re-execute the steps on every power up. Thus, the memory can store a flag or other indicator (e.g., timestamp) indicating when the memory was most recently updated. In one embodiment, the method (200) can proceed to step 210 if it is determined that the memory has not been written to since manufacturing. In another embodiment, the method (200) can proceed to step 210 if the memory was written to, but new data is available (which may be queried from the production line server, discussed below). In another embodiment, the method (200) may periodically "re-flash" the memory according to a set interval.

In the illustrated embodiment, the production line server can comprise a locally available server (e.g., during manufacturing) or a remote server (e.g., after manufacturing). As described above, the device housing the memory can have its own network interfaces. Alternatively, when installed in an ECU, the ECU can access one or more network interfaces over a CAN bus. In either event, these communication buses can include Bluetooth, Wi-Fi, cellular, satellite, or other network devices.

In some embodiments, establishing communication with a server can comprise cycling through network interfaces and attempting to establish a connection with a known server. In one embodiment, the method (200) queries for Bluetooth devices within range of the device housing the memory. Next, the method (200) may broadcast a request for the Internet Protocol (IP) address of the production line server using a Wi-Fi network. Then, if no Wi-Fi network is available, the method (200) may access a trusted third-party server using a cellular or satellite network to identify the location of the production line server.

Once identifying how to connect to the production line server, the device housing the memory connects to the production line server. In some embodiments, this connection is made over a CAN bus. In other embodiments, the connection can be made directly using a network interface on the device housing the memory.

In step 212, after connecting to the production line server, the memory receives and installs image data.

In one embodiment, the image data comprises media, application, and any other data used by the device housing the memory. For example, the memory may be installed within an infotainment ECU. In this embodiment, the image data includes media and applications. As another example, the memory may be installed within a routing ECU and the image data includes global positioning system (GPS) data or global information system (GIS) data. In general, the type of data included in the image comprises all data required for the device housing the memory to operate but the specific contents of the image are not limiting.

In step 214, after installing the image, the method (200) verifies the integrity of the image. In some embodiments, the method (200) computes a cyclic redundancy check (CRC) to confirm that the data in the image was installed correctly into the memory. In some embodiments, the integrity check may be requested by the production line server. Once the image is successfully installed into memory, the process ends. Thus, in the illustrated method (200) a memory of, for example, an ECU is initially preloaded with a small test program (FIG. 1) and subsequently loaded with the final application and other software during a separate phase (FIG. 2).

Figure 3:
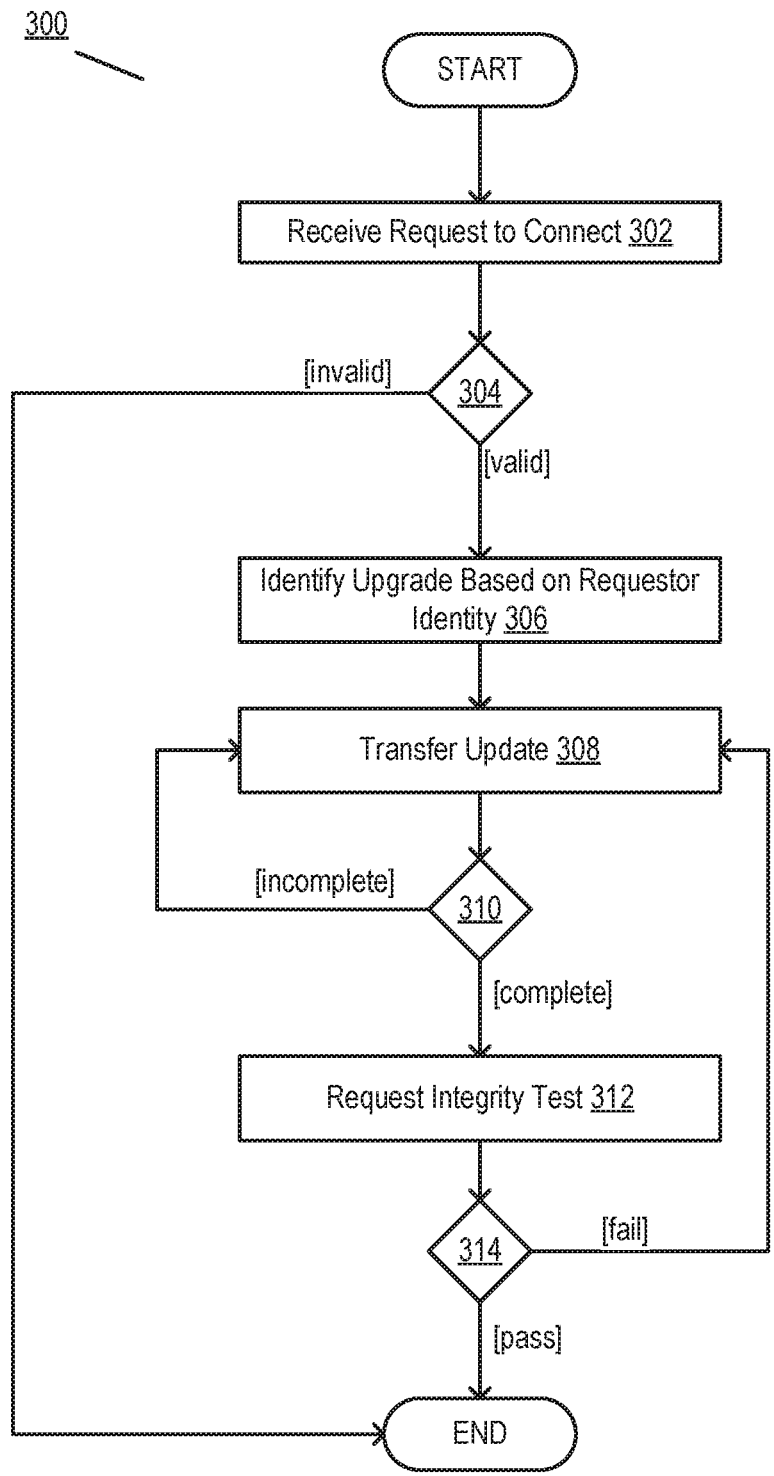
FIG. 3 is a flow diagram illustrating a method for initializing a memory according to some embodiments of the disclosure.

FIG. 3 is a flow diagram illustrating a method for initializing a memory according to some embodiments of the disclosure. In one embodiment, an original equipment manufacturer (OEM) performs the method (300). In this embodiment, some or all of the steps may be implemented as part of an OEM production line system. Specifically, in some embodiments, the method (300) is implemented as part of an industrial installation production line of a vehicle manufacturer.

In step 302, the method (300) receives a request to connect from a device housing a memory. In the illustrated embodiment, step 302 comprises the reciprocal of step 210 the details of which are not repeated herein but apply equally to step 302.

In step 304, the method (300) confirms the identity of the sender.

In the illustrated embodiment, the method (300) can cryptographically confirm the identity of the sender using an established protocol such as DICE-RIoT or similar protocols. If the method (300) cannot verify the identity of the sender, the method (300) ends.

In step 306, the method (300) identifies an update based on the identity of the requesting device.

In some embodiments, the requesting device includes a unique device identifier (e.g., a GUID, serial number, etc.) that uniquely identifies a make and/or model of the device. In the illustrated embodiment, the production line server includes a mapping of images to such identifiers to coordinate image delivery. In step 306, this mapping is consulted by extracting the unique identifier of the requesting device and identifying the appropriate image.

In step 308, the update is transferred to the requesting device and the method (300) continues transferring the update until detecting that the transfer is complete (310). The transfer of an update is described in the description of FIG. 2 and is not repeated herein.

In step 312, the requesting device is requested to perform an integrity test. As described above, in some embodiments, this integrity test comprises a CRC check, MD5 check or similar check.

In step 314, if the pass fails, the method (300) re-transfers to the update and executes steps 308 through 312 until the integrity test passes. Alternatively, if the test passes, the method (300) ends. In the illustrated embodiment, the production line server receives a pass/fail indicator from the requesting device upon the requesting device executing the integrity test.

Figure 4:
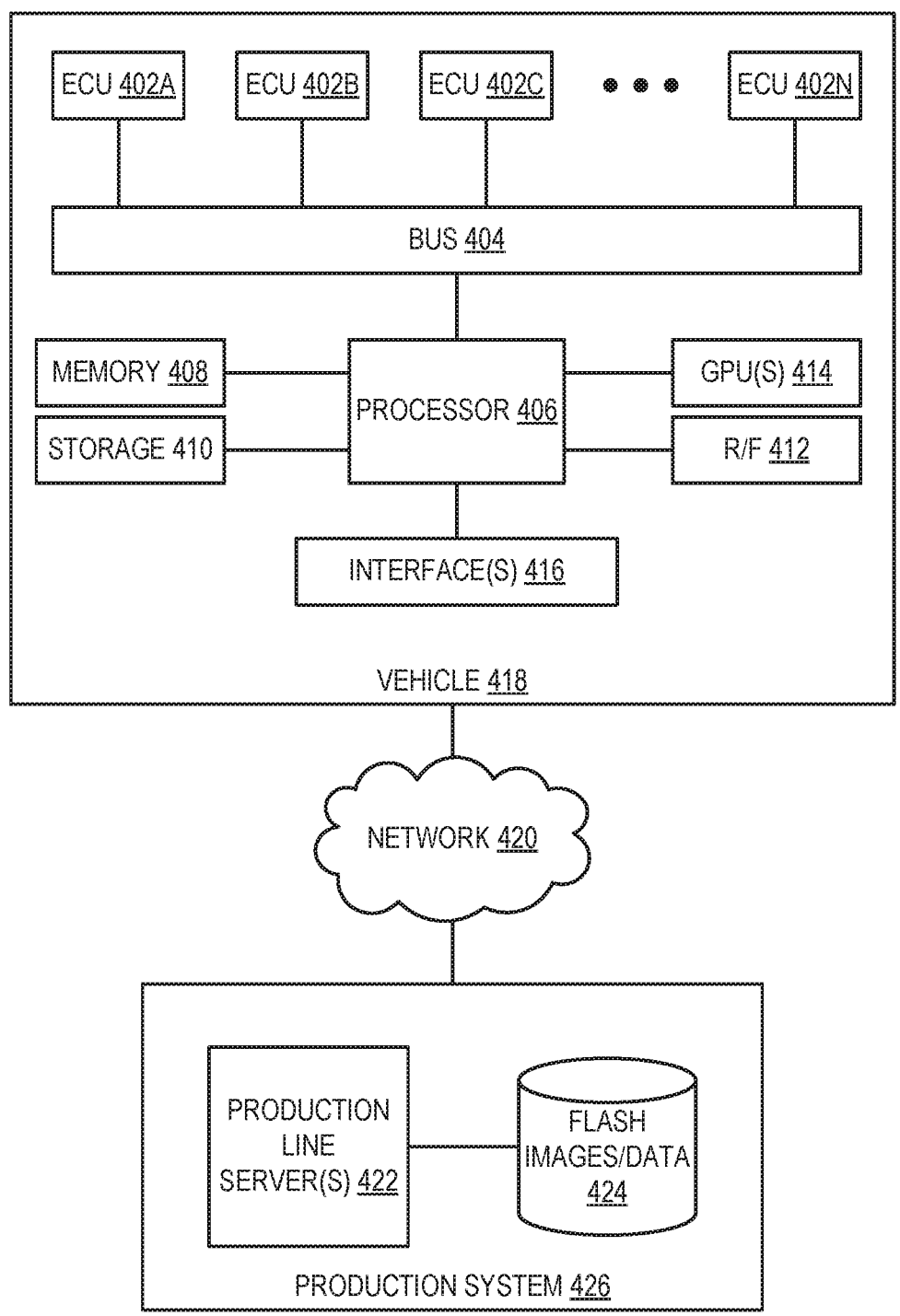
FIG. 4 is a block diagram illustrating a system for initializing a memory according to some embodiments of the disclosure.

FIG. 4 is a block diagram illustrating a system (400) for initializing a memory according to some embodiments of the disclosure.

In FIG. 4, a vehicle (418) is connected to a production system (426) via a network (420). Vehicle (418) can comprise any type of vehicle (e.g., automobile, boat, etc.). Generally, vehicle can comprise any superstructure housing various discrete computing systems and a vehicle is provided as an example. Network (420) comprises any type of network such as a short-range network (e.g., Bluetooth, Wi-Fi, etc.) or long-range network (e.g., cellular, satellite, etc.). Production system (426) comprises a computer system operated by a manufacturer. For example, production system (426) can comprise a network computer system controlling an assembly or production line manufacturing the vehicle (418).

Vehicle (418) includes one or more ECUs (402a-402n). Examples of ECUs include door control unit (DCU), engine control unit, electric power steering control unit (PSCU), human-machine interface (HMI), powertrain control module (PCM), seat control unit, speed control unit (SCU), telematic control unit (TCU), transmission control unit (TCU), brake control module (BCM; ABS or ESC), or battery management system (BMS) devices. While described primarily in the context of ECU devices, any type of computing system including a Flash memory may employ the embodiments disclose herein and embodiments referencing ECU devices are provided as examples. An exemplary configuration of an EUC is provided in FIG. 5, and that discussion is not repeated herein.

ECUs (402a-402n) are each connected to a bus (404). In some embodiments, the bus (404) comprises a CAN Bus, FlexRay MOST bus, or any other type of bidirectional communication bus.

The processing side of the system includes one or more processors (406), short-term memory (408), an RF system (412), graphics processing units (GPUs) (414), long-term storage (410) and one or more interfaces (418).

The one or more processors (406) may comprise central processing units, FPGAs, or any range of processing devices needed to support the operations of the autonomous vehicle. Memory (408) comprises DRAM or other suitable volatile RAM for temporary storage of data required by processors (406). RF system (412) may comprise a cellular transceiver and/or satellite transceiver. Long-term storage (410) may comprise one or more high-capacity solid-state drives (SSDs). In general, long-term storage (410) may be utilized to store, for example, high-definition maps, routing data, and any other data requiring permanent or semi-permanent storage. GPUs (414) may comprise one more high throughput GPU devices for processing data received from autonomous vehicle subsystem (702A). Finally, interfaces (418) may comprise various display units positioned within the autonomous vehicle (e.g., an in-dash screen).

In the illustrated embodiment, the production system (426) includes one or more production line servers (422). In the illustrated embodiment, these servers (422) can comprise application servers capable of handling requests received from vehicle (418) over network (420). For example, the servers (422) can comprise web servers, transmission control protocol (TCP) servers, user datagram protocol (UDP) servers or any other type of server capable of receiving requests and issuing images in response. These images are stored within data store (424). In one embodiment, data store (424) comprises a combination of databases and file storage.

Figure 5:
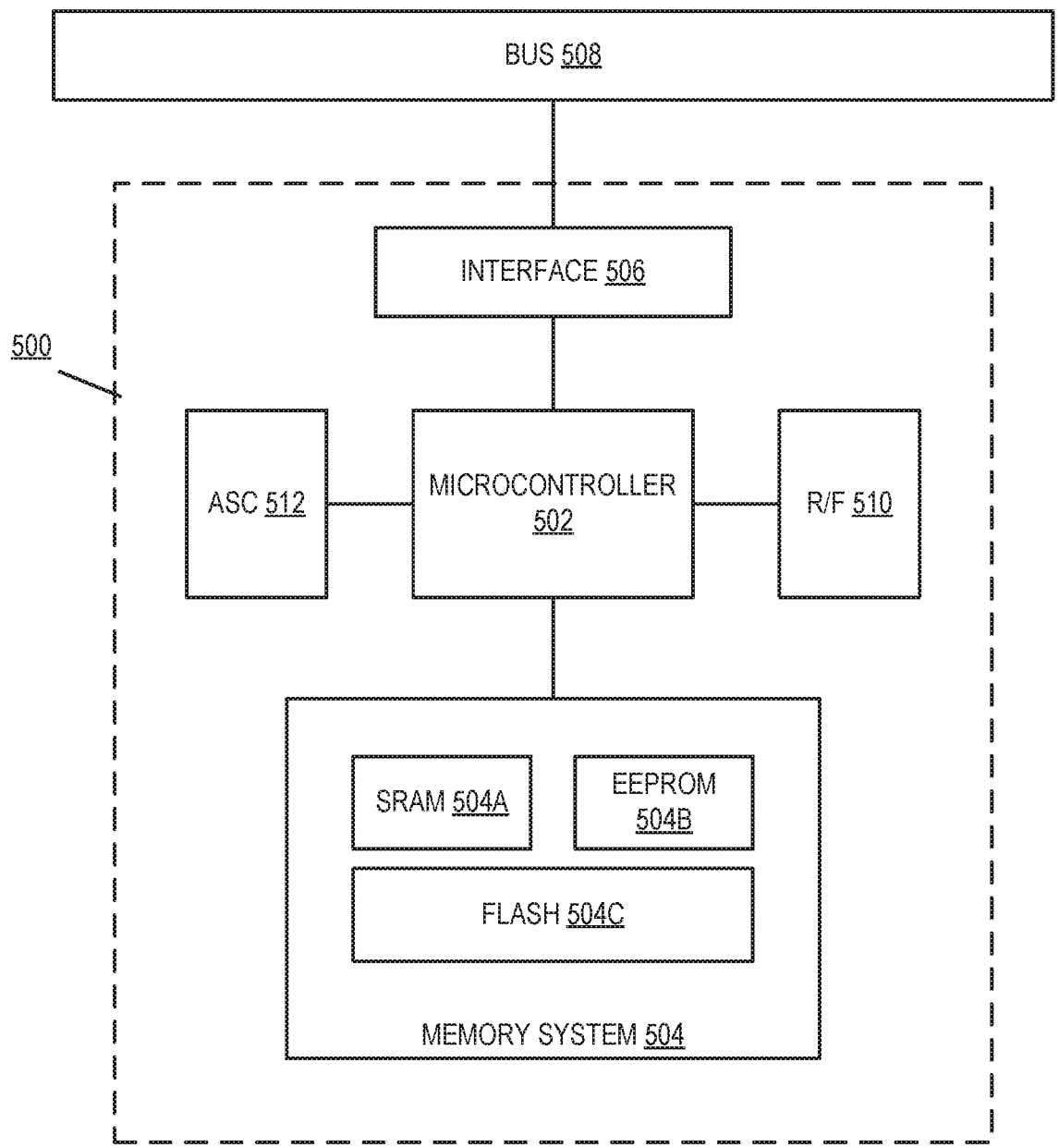
FIG. 5 is a block diagram of an ECU according to some embodiments of the disclosure.

FIG. 5 is a block diagram of an ECU according to some embodiments of the disclosure.

In the illustrated embodiment, an ECU (500) is communicatively coupled to a bus (508) via an interface (506). As discussed above, the bus (508) may comprise a CAN, FlexRay, MOST bus or similar type of bus. Correspondingly, the interface (506) may comprise a similar interface for accessing the specific type of bus used.

The ECU (500) additionally includes a microcontroller (502), R/F subsystem (510), application-specific components (ASC) (512) and memory system (504). In the illustrated embodiment, the microcontroller (502) can comprise a processor or smaller microcontroller configured to control operations of the ECU (500). In some embodiments, the microcontroller (502) accesses program instructions stored in the memory system (504) and, according to those instructions, drives ASC (512). Examples of ASC (512) include actuators for door controls, display units for infotainment ECUs, transmission control devices for TCUs, and various other controls. The types of ASCs employed by the ECU (500) are not limiting and any type of ASCs may be employed by the ECU (500).

ECU (500) additionally includes an R/F system (510). In the illustrated embodiment, the R/F system (510) may include one or more radios or transceivers for communicating with wireless networks. R/F system (510) may include Bluetooth, Wi-Fi or cellular radios or satellite transceivers. In some embodiments, R/F system (510) includes a combination of radios or transceivers. In some embodiments, ECU (500) may not include an R/F system (510) and may instead utilize a vehicle-wide R/F system, as described previously.

Microcontroller (502) manages memory system (504). In the illustrated embodiment, memory system (504) includes SRAM (504a), EEPROM (504b), and Flash storage (504c). In the illustrated embodiment, SRAM (504a) may be utilizes as an L1 or L2 cache for microcontroller (502). Similarly, EEPROM (504b) may be used as firmware storage for the ECU (500). The specific details (or presence) of SRAM (504a) and EEPROM (504b) is not limiting.

Memory system (504) additionally includes a Flash storage device (504c). In the illustrated embodiment, the Flash storage device (504c) comprises a NAND Flash storage device soldered to a PCB and connected (via the PCB) to the other components depicted in FIG. 5. Flash storage device (504c) is utilized to storage operating code as well as data used by the ECU (500) as described previously.

The present disclosure has been described more fully hereinafter with reference to the accompanying drawings, which form a part hereof, and which show, by way of illustration, certain example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used above may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for the existence of additional factors not necessarily expressly described, again, depending at least in part on context.

The present disclosure has been described with reference to block diagrams and operational illustrations of methods and devices. It is understood that each block of the block diagrams or operational illustrations, and combinations of blocks in the block diagrams or operational illustrations, can be implemented by means of analog or digital hardware and computer program instructions. These computer program instructions can be provided to a general-purpose processor, a special-purpose computer, ASIC, or other programmable data processing apparatus, such that the instructions, which execute via the processor of the computer or other programmable data processing apparatus, implement the functions/acts specified in the block diagrams or operational block or blocks. In some alternate implementations, the functions/acts noted in the blocks can occur out of the order noted in the operational illustrations. For example, two blocks shown in succession can in fact be executed substantially concurrently or the blocks can sometimes be executed in the reverse order, depending upon the functionality/acts involved.

For the purposes of this disclosure a computer-readable medium (or computer-readable storage medium/media) stores computer data, which data can include computer program code (or computer-executable instructions) that is executable by a computer, in machine-readable form. By way of example, and not limitation, a computer-readable medium may comprise computer-readable storage media, for tangible or fixed storage of data, or communication media for transient interpretation of code-containing signals. Computer-readable storage media, as used herein, refers to physical or tangible storage (as opposed to signals) and includes without limitation volatile and non-volatile, removable and non-removable media implemented in any method or technology for the tangible storage of information such as computer-readable instructions, data structures, program modules or other data. Computer-readable storage media includes, but is not limited to, RAM, ROM, EPROM, EEPROM, flash memory or other solid-state memory technology, CD-ROM, DVD, or other optical storage, magnetic cassettes, magnetic tape, magnetic disk storage or other magnetic storage devices, or any other physical or material medium which can be used to tangibly store the desired information or data or instructions and which can be accessed by a computer or processor.

What is claimed is:

1. A method comprising: writing a test program to a first region of a memory device during production of the memory device; executing a self-test program in response to detecting a first power up of the memory device, the self-test program stored within the test program; and retrieving and installing an image from a remote data source in response to detecting a subsequent power up, during an installation process of the memory device, the retrieving performed by the test program.

2. The method of claim 1, further comprising detecting that the memory device is connected to a bus upon detecting the subsequent power up.

3. The method of claim 1, the retrieving the image comprising establishing communications with a production line server, the production line server storing one or more images including the image.

4. The method of claim 1, the writing a test program comprising writing the test program after soldering the memory device to a printed circuit board.

5. The method of claim 1, the writing a test program including one or more communications drivers and self-programming software.

6. The method of claim 1, further comprising running an integrity test on the installed image.

7. The method of claim 1, the retrieving the image comprising retrieving the image using an over-the-air network.

8. A device comprising: a microcontroller; and a non-transitory computer readable storage medium for tangibly storing thereon program instructions for execution by the processor, the stored program instructions comprising a test program written to a first region of a memory device during production of the memory device, the test program configured to: execute a self-test program stored within the test program in response to detecting a first power up of the memory device; and retrieve and install an image from a remote data source in response to detecting a subsequent power up, during an installation process of the memory device, the retrieving performed by the test program.

9. The device of claim 8, the test program further configured to detect that the device is connected to a bus upon detecting the subsequent power up.

10. The device of claim 8, the retrieving the image comprising establishing communications with a production line server, the production line server storing one or more images including the image.

11. The device of claim 8, the writing a test program comprising writing the test program after soldering the memory device to a printed circuit board.

12. The device of claim 8, the writing a test program including one or more communications drivers and self-programming software.

13. The device of claim 8, the test program further configured to run an integrity test on the installed image.

14. The device of claim 8, the retrieving the image comprising retrieving the image using an over-the-air network.

15. A non-transitory computer readable storage medium for tangibly storing computer program instructions capable of being executed by a computer processor, the computer program instructions defining the steps of: writing a test program to a first region of a memory device during production of the memory device; executing a self-test program in response to detecting a first power up of the memory device, the self-test program stored within the test program; and retrieving and installing an image from a remote data source in response to detecting a subsequent power up, during an installation process of the memory device, the retrieving performed by the test program.

16. The non-transitory computer readable storage medium of claim 15, the computer program instructions further defining the step of detecting that the memory device is connected to a bus upon detecting the subsequent power up.

17. The non-transitory computer readable storage medium of claim 15, the retrieving the image comprising establishing communications with a production line server, the production line server storing one or more images including the image.

18. The non-transitory computer readable storage medium of claim 15, the writing a test program comprising writing the test program after soldering the memory device to a printed circuit board.

19. The non-transitory computer readable storage medium of claim 15, the writing a test program including one or more communications drivers and self-programming software.

20. The non-transitory computer readable storage medium of claim 15, the computer program instructions further defining the step of running an integrity test on the installed image.

21. The non-transitory computer readable storage medium of claim 15, the retrieving the image comprising retrieving the image using an over-the-air network.

\* \* \* \* \*